United States Patent
Hashemi et al.

(10) Patent No.: US 9,866,201 B2
(45) Date of Patent: Jan. 9, 2018

(54) ALL-ACOUSTIC DUPLEXERS USING DIRECTIONAL COUPLERS

(71) Applicant: Abtum Inc., Irvine, CA (US)

(72) Inventors: Hossein Hashemi, Pacific Palisades, CA (US); Behnam Analui, Irvine, CA (US)

(73) Assignee: Abtum Inc., Irvine, CA (US)

( * ) Notice: Subject to any disclaimer, the term of this patent is extended or adjusted under 35 U.S.C. 154(b) by 35 days.

(21) Appl. No.: 15/217,225

(22) Filed: Jul. 22, 2016

(65) Prior Publication Data
US 2017/0070205 A1    Mar. 9, 2017

Related U.S. Application Data

(60) Provisional application No. 62/215,444, filed on Sep. 8, 2015.

(51) Int. Cl.
| | |
|---|---|
| H03H 9/52 | (2006.01) |
| H03H 9/64 | (2006.01) |
| H03H 9/72 | (2006.01) |
| H01P 5/18 | (2006.01) |
| H03H 9/70 | (2006.01) |
| H03H 9/02 | (2006.01) |

(52) U.S. Cl.
CPC .............. *H03H 9/725* (2013.01); *H01P 5/18* (2013.01); *H03H 9/706* (2013.01); *H03H 2009/02165* (2013.01)

(58) Field of Classification Search
CPC ..... H03H 9/6443; H03H 9/6466; H03H 9/725
USPC ........................................ 333/133, 195, 117
See application file for complete search history.

(56) References Cited

U.S. PATENT DOCUMENTS

| | | | |
|---|---|---|---|
| 2,561,212 A | 7/1951 | Lewis | |
| 3,025,463 A | 3/1962 | Luoma et al. | |
| 3,453,638 A | 7/1969 | Hoovler | |
| 3,704,409 A | 11/1972 | Oomen | |
| 3,800,218 A | 3/1974 | Shekel | |
| 3,911,381 A * | 10/1975 | Brooks .................. | G10K 11/36 333/195 |

(Continued)

FOREIGN PATENT DOCUMENTS

| | | |
|---|---|---|
| DE | 102012107877 A1 | 2/2014 |
| EP | 1091497 A1 | 4/2001 |

(Continued)

OTHER PUBLICATIONS

EESR for European Appl. No. 13876497.2, dated Jul. 4, 2016.

(Continued)

*Primary Examiner* — Dean Takaoka
(74) *Attorney, Agent, or Firm* — McAndrews, Held & Malloy, Ltd.

(57) ABSTRACT

An all-acoustic filter includes acoustic directional couplers and acoustic filters. In one embodiment, the all-acoustic filter includes two acoustic directional couplers, pair of matched acoustic filters corresponding to either transmit or receive frequency bands, and another acoustic filter corresponding to the other of transmit or receive frequency bands. An all-acoustic duplexer may be realized monolithically in a small form factor, may be tunable, may support multiple transmit or receive frequency bands, or may include schemes for antenna mismatch correction.

20 Claims, 17 Drawing Sheets

(56) References Cited

U.S. PATENT DOCUMENTS

| | | | |
|---|---|---|---|
| 4,029,902 A | 6/1977 | Bell et al. | |
| 4,146,851 A | 3/1979 | Dempsey | |
| 4,379,274 A * | 4/1983 | Hansen | H03H 9/02842 310/313 D |
| 4,427,936 A | 1/1984 | Riblet et al. | |
| 4,464,675 A | 8/1984 | Balaban et al. | |
| 4,489,271 A | 12/1984 | Riblet | |
| 4,694,266 A | 9/1987 | Wright | |
| 4,721,901 A | 1/1988 | Ashley | |
| 4,963,945 A | 10/1990 | Cooper et al. | |
| 4,964,945 A | 10/1990 | Cooper et al. | |
| 4,968,967 A | 11/1990 | Stove | |
| 5,408,690 A | 4/1995 | Ishikawa et al. | |
| 5,483,248 A | 1/1996 | Milroy | |
| 5,493,246 A | 2/1996 | Anderson | |
| 5,525,945 A | 6/1996 | Chiappetta et al. | |
| 5,574,400 A | 11/1996 | Fukuchi | |
| 5,691,978 A | 11/1997 | Kenworthy | |
| 5,781,084 A | 7/1998 | Rhodes | |
| 6,178,310 B1 | 1/2001 | Jeong | |
| 6,194,980 B1 | 2/2001 | Thon | |
| 6,229,992 B1 | 5/2001 | McGeehan et al. | |
| 6,262,637 B1 | 7/2001 | Bradley | |
| 6,297,711 B1 | 10/2001 | Seward et al. | |
| 6,496,061 B1 | 12/2002 | Bloom | |
| 6,721,544 B1 | 4/2004 | Franca-Neto | |
| 6,819,302 B2 | 11/2004 | Volman | |
| 6,946,847 B2 | 9/2005 | Nishimori et al. | |
| 7,072,614 B1 | 7/2006 | Kasperkovitz | |
| 7,116,966 B2 | 10/2006 | Hattori et al. | |
| 7,123,883 B2 | 10/2006 | Mages | |
| 7,250,830 B2 | 7/2007 | Layne et al. | |
| 7,283,793 B1 | 10/2007 | McKay | |
| 7,330,500 B2 | 2/2008 | Kouki | |
| 7,369,811 B2 | 5/2008 | Bellatoni et al. | |
| 7,623,005 B2 | 11/2009 | Johansson et al. | |
| 7,633,435 B2 | 12/2009 | Meharry et al. | |
| 7,636,388 B2 | 12/2009 | Wang et al. | |
| 7,711,329 B2 | 5/2010 | Aparin et al. | |
| 7,804,383 B2 | 9/2010 | Volatier et al. | |
| 7,894,779 B2 | 2/2011 | Meiyappan et al. | |
| 8,013,690 B2 | 9/2011 | Miyashiro | |
| 8,135,348 B2 | 3/2012 | Aparin | |
| 8,149,742 B1 | 4/2012 | Sorsby | |
| 8,199,681 B2 | 6/2012 | Zinser et al. | |
| 8,385,871 B2 | 2/2013 | Wyville | |
| 8,422,412 B2 | 4/2013 | Hahn | |
| 8,514,035 B2 | 8/2013 | Mikhemar et al. | |
| 8,600,329 B1 | 12/2013 | Comeau et al. | |
| 8,620,246 B2 | 12/2013 | McKinzie et al. | |
| 8,749,321 B2 | 6/2014 | Kim et al. | |
| 8,761,026 B1 | 6/2014 | Berry et al. | |
| 8,942,657 B2 | 1/2015 | McKinzie, III et al. | |
| 8,957,742 B2 | 2/2015 | Spears et al. | |
| 9,048,805 B2 | 6/2015 | Granger et al. | |
| 9,214,718 B2 | 12/2015 | Mow et al. | |
| 9,450,553 B2 | 9/2016 | Langer et al. | |
| 9,479,214 B2 | 10/2016 | Webb et al. | |
| 9,490,866 B2 | 11/2016 | Goel et al. | |
| 9,500,727 B2 | 11/2016 | Sohn et al. | |
| 9,543,630 B2 | 1/2017 | Tokumitsu et al. | |
| 2002/0089396 A1 | 7/2002 | Noguchi et al. | |
| 2003/0109077 A1 | 6/2003 | Kim et al. | |
| 2004/0000425 A1 | 1/2004 | White et al. | |
| 2004/0127178 A1 | 7/2004 | Kuffner | |
| 2004/0180633 A1 | 9/2004 | Nakatani et al. | |
| 2005/0070232 A1 | 3/2005 | Mages | |
| 2005/0245213 A1 | 11/2005 | Hirano et al. | |
| 2005/0289632 A1 | 12/2005 | Brooks | |
| 2006/0019611 A1 | 1/2006 | Mages | |
| 2007/0105509 A1 | 5/2007 | Muhammad | |
| 2008/0128901 A1 | 6/2008 | Zurcher et al. | |
| 2008/0227409 A1 | 9/2008 | Chang et al. | |
| 2008/0240000 A1 | 10/2008 | Kidd | |
| 2008/0261519 A1 | 10/2008 | Demarco et al. | |
| 2009/0054008 A1 | 2/2009 | Satou | |
| 2009/0121797 A1 | 5/2009 | Karabatsos | |
| 2009/0125253 A1 | 5/2009 | Blair et al. | |
| 2009/0252252 A1 | 10/2009 | Kim et al. | |
| 2009/0253385 A1 | 10/2009 | Dent et al. | |
| 2009/0289744 A1 | 11/2009 | Miyashiro | |
| 2010/0002620 A1 | 1/2010 | Proctor et al. | |
| 2010/0084146 A1 | 4/2010 | Roberts | |
| 2010/0109771 A1 | 5/2010 | Baik et al. | |
| 2010/0127795 A1 | 5/2010 | Bauer et al. | |
| 2010/0134700 A1 | 6/2010 | Robert et al. | |
| 2010/0148886 A1 | 6/2010 | Inoue et al. | |
| 2010/0177917 A1 | 7/2010 | Van Der Werf | |
| 2010/0323654 A1 | 12/2010 | Judson et al. | |
| 2011/0069644 A1 | 3/2011 | Kim et al. | |
| 2011/0080229 A1 | 4/2011 | Kenington | |
| 2011/0080856 A1 | 4/2011 | Kenington | |
| 2011/0134810 A1 | 6/2011 | Yamamoto et al. | |
| 2011/0140803 A1 | 6/2011 | Kim et al. | |
| 2011/0227664 A1 | 9/2011 | Wyville | |
| 2011/0256857 A1 | 10/2011 | Chen et al. | |
| 2012/0007605 A1 | 1/2012 | Benedikt | |
| 2012/0063496 A1 | 3/2012 | Giannini et al. | |
| 2012/0075069 A1 | 3/2012 | Dickey et al. | |
| 2012/0140860 A1 | 6/2012 | Rimini et al. | |
| 2012/0154071 A1 | 6/2012 | Bradley et al. | |
| 2012/0161784 A1 | 6/2012 | Benedikt | |
| 2012/0163245 A1 | 6/2012 | Tone et al. | |
| 2012/0194269 A1 | 8/2012 | Schlager | |
| 2012/0201153 A1 | 8/2012 | Bharadia et al. | |
| 2012/0201173 A1 | 8/2012 | Jain et al. | |
| 2012/0212304 A1 | 8/2012 | Zhang et al. | |
| 2012/0230227 A1 | 9/2012 | Weiss | |
| 2013/0016634 A1 | 1/2013 | Smiley | |
| 2013/0063299 A1 | 3/2013 | Proudkii | |
| 2013/0065542 A1 | 3/2013 | Proudkii | |
| 2013/0079641 A1 | 3/2013 | Zwirn | |
| 2013/0083703 A1 | 4/2013 | Granger-Jones et al. | |
| 2013/0109330 A1 | 5/2013 | Sahota et al. | |
| 2013/0113576 A1 | 5/2013 | Inoue et al. | |
| 2013/0130619 A1 | 5/2013 | Harverson et al. | |
| 2013/0154887 A1 | 6/2013 | Hein et al. | |
| 2013/0201880 A1 | 8/2013 | Bauder et al. | |
| 2013/0201881 A1 | 8/2013 | Bauder et al. | |
| 2013/0201882 A1 | 8/2013 | Bauder et al. | |
| 2013/0222059 A1 | 8/2013 | Kilambi et al. | |
| 2013/0241655 A1 | 9/2013 | Liss et al. | |
| 2013/0241669 A1 | 9/2013 | Mikhemar et al. | |
| 2013/0242809 A1 | 9/2013 | Tone et al. | |
| 2013/0245976 A1 | 9/2013 | Hind | |
| 2013/0301488 A1 | 11/2013 | Hong et al. | |
| 2013/0321097 A1 | 12/2013 | Khlat et al. | |
| 2014/0103946 A1 | 4/2014 | Vanden Bossche | |
| 2014/0169236 A1 | 6/2014 | Choi et al. | |
| 2014/0194073 A1 | 7/2014 | Wyville et al. | |
| 2014/0204808 A1 | 7/2014 | Choi et al. | |
| 2014/0348018 A1 | 11/2014 | Bharadia et al. | |
| 2014/0376419 A1 | 12/2014 | Goel et al. | |
| 2015/0049841 A1 | 2/2015 | Laporte et al. | |
| 2015/0118978 A1 | 4/2015 | Khlat | |
| 2015/0163044 A1 | 6/2015 | Analui et al. | |
| 2015/0236390 A1 | 8/2015 | Analui et al. | |
| 2015/0236842 A1 | 8/2015 | Goel et al. | |
| 2016/0050031 A1 | 2/2016 | Hwang et al. | |
| 2016/0134325 A1 | 5/2016 | Tageman et al. | |
| 2016/0204821 A1 | 7/2016 | Han et al. | |
| 2016/0211870 A1 | 7/2016 | Wu et al. | |
| 2016/0380706 A1 | 12/2016 | Tanzi et al. | |
| 2017/0030339 A1 | 2/2017 | Proudfoot | |
| 2017/0070368 A1 | 3/2017 | Mandegaran | |

FOREIGN PATENT DOCUMENTS

| | | |
|---|---|---|
| EP | 2733855 A1 | 5/2014 |
| EP | 2814172 A1 | 12/2014 |
| EP | 2960981 A1 | 12/2015 |
| KR | 10-2010-0134324 A | 12/2010 |
| WO | 9515018 A1 | 6/1995 |
| WO | 2014032883 A1 | 3/2014 |

(56) References Cited

FOREIGN PATENT DOCUMENTS

| WO | 2014133625 A2 | 9/2014 |
|---|---|---|
| WO | 2015089091 A1 | 6/2015 |
| WO | 2016063108 A1 | 4/2016 |

OTHER PUBLICATIONS

Office Action for U.S. Appl. No. 14/626,572, dated Jul. 15, 2016.
Office Action for U.S. Appl. No. 14/622,627, dated May 20, 2016.
Office Action for U.S. Appl. No. 14/626,572, dated Mar. 31, 2016.
ISR for Application No. PCT/US2016/050466, dated Nov. 29, 2016.
Office Action for U.S. Appl. No. 14/626,572, dated Jul. 29, 2015.
ISR and Written Opinion for PCT Application No. PCT/US2015/016642, dated Jun. 25, 2015.
Hunter et al., "Passive Microwave Receive Filter Networks Using Low-Q Resonators," IEEE Microwave Magazine, pp. 46-53, (2005).
Laforge et al., "Diplexer design implementing highly miniaturized multilayer superconducting hybrids and filters," IEEE Transactions on Applied Superonductivity, pp. 47-54, (2009).
Marcatili et al., "Band-Splitting Filter," Bell System Technical Journal, pp. 197-212, (1961).
Matthaei et al., "Microwave Filters, Impedance-Matching Networks, and Coupling Structures," Chapter 14: Directional, Channel—Separation Filters and Traveling-WAve Ring-Resonators, pp. 843-887, Copyright 1980 Artech House, Inc., Dedham, MA; reprint of edition published by McGraw-Hill Book Company, 1964.
Matthaei et al., "Microwave Filters, Impedance-Matching Networks, and Coupling Structures," Chapter 16: Multiplexer Design, pp. 965-1000, Copyright 1980 Artech House, Inc., Dedham, MA; reprint of edition published by McGraw-Hill Book Company, 1964.
Phudpong et al., "Nonlinear Matched Reflection Mode and stop Filters for Frequency Selective Limiting Applications," Microwave Symposium Conference, IEEE/MTT-S International, pp. 1043-1046, (2007).
ISR and Written Opinion for PCT/US2014/069372, dated Mar. 3, 2015.
ISR and Written Opinion for PCT/US2015/016145, dated May 20, 2015.
ISR and Written Opinion for PCT/US2015/015930, dated May 27, 2015.
Korean International Searching Authority, ISR and Written Opinion for PCT/US2013/074155, dated Sep. 23, 2014.
Kannangara et al., "Analysis of an Adaptive Wideband Duplexer With Double-Loop Cancellation," IEEE Transactions on Vehicular Technology, vol. 56, No. 4, pp. 1761-1982, (2007).
Notice of Allowance for U.S. Appl. No. 14/102,244, dated Jul. 20, 2016.
Office Action for U.S. Appl. No. 14/102,244, dated Sep. 22, 2015.
Office Action for U.S. Appl. No. 14/102,244, dated Jun. 15, 2015.
ISR and Written Opinion for PCT/2016/054646, dated Dec. 29, 2016.
PCT, Notification of Transmittal of the International Search Report and the Written Opinion of the International Searching Authority, or the Declaration, in International Application No. PCT/US16/50466, dated Nov. 29, 2016 (7 pages).

\* cited by examiner

ABSTRACT# ALL-ACOUSTIC DUPLEXERS USING DIRECTIONAL COUPLERS

CROSS-REFERENCE TO RELATED APPLICATIONS/INCORPORATION BY REFERENCE

This patent application makes reference to, claims priority to, and claims benefit from U.S. Provisional Application No. 62/215,444, filed on Sep. 8, 2015.

The above-referenced application is hereby incorporated herein by reference in its entirety.

FIELD OF THE DISCLOSURE

Certain embodiments of the disclosure relate to radio frequency (RF) filters and duplexers. More specifically, certain embodiments of the disclosure relate to a method and system for all-acoustic duplexers that use acoustic directional couplers and acoustic filters for various communication systems including frequency division duplex, multi-standard, multi-antenna, or multi-band communication standards, for example.

BACKGROUND OF THE DISCLOSURE

RF filters and duplexers have been essential components of communication systems. High selectivity, low insertion loss, compact size, ability to handle large signals (power handling), high linearity, manufacturability, and low cost may be some of the important desired features for RF filters and duplexers.

The requirements for RF filters and duplexers have become more stringent in light of new communication standards where information channels and frequency bands are closer to each other, new communication devices such as smartphones where the footprint and cost of all components must be very small as more components are needed in support of multiple standards and applications, and co-existent communication systems where multiple communication transmitters and receivers work simultaneously.

Linearity, noise, and power handling requirements typically lead to utilization of passive RF filters and duplexers in many applications. The performance of passive RF filters and duplexers may be limited by the quality factor (Q) of the components that are used in their realization. The filter selectivity as well as passband requirement may lead to a filter topology and filter order. For a given RF filter or duplexer topology and order, insertion loss may reduce with the increase of component Q.

Various technologies can be used to realize passive RF filters and duplexers. For instance, capacitors, inductors, or transmission lines can be used to realize passive RF filters and duplexers. Electromagnetic resonators, including transmission line and dielectric waveguide resonators, can also be used to realize passive filters and duplexers. The quality factor of such components is typically proportional to their overall physical size. As such, it has been difficult to realize compact low-loss selective passive RF filters and duplexers using electromagnetic components and resonators.

Piezoelectric material can be used to realize compact high-Q resonators. Crystal resonators have been widely used to generate spectrally-pure oscillators. Surface acoustic wave (SAW) resonators have been widely used to realize compact low-loss selective RF filters and duplexers as well as oscillators. More recently, bulk acoustic wave (BAW) resonators have been used to construct high-performance RF filters and duplexers as well as oscillators.

Ceramic resonators and micro electro mechanical system (MEMS) resonators with high quality factor have also been used in frequency generation as well as filtering applications.

RF SAW filters and duplexers have been used widely in wireless communications such as cellular phones, wireless local area network (WLAN) transceivers, global positioning system (GPS) receivers, cordless phones, and so forth. RF SAW filters have been used as band-select filters, image-reject filters, intermediate frequency (IF) filters, transmitter noise or spur reduction filters, and so forth. A typical smartphone may have several SAW resonators, SAW filters, and SAW duplexers to support various communication systems and standards.

Over the past decade, significant research and development on BAW technology has resulted in BAW resonators that have lower loss (or higher Q) or are more compact, especially at higher frequencies, compared with SAW resonators. Therefore, RF filters and duplexers that use BAW resonators may have lower insertion loss, or higher selectivity, or smaller form factor compared with those that utilize SAW resonators especially at higher frequencies. Thin film bulk acoustic resonators (FBAR) and solidly mounted resonators (SMR) are a common example of BAW resonators.

Modern wireless communication standards designate many different operational frequency bands to support the increase in the overall wireless capacity and reach. For instance, cellular phone standards may include RF frequency bands that span around 700 MHz to around 4000 MHz. Furthermore, in order to increase the overall wireless capacity, the frequency spacing between adjacent frequency bands or channels within the same application or different applications may be reduced. This may be done, for instance, by reducing the typical guard bands in wireless standard or by placing the transmit and receive frequency bands in a frequency division duplex (FDD) scheme closer to each other. As a result, RF filters and duplexers with higher selectivity may be required. More selective RF filters and duplexers that utilize a given component or technology (SAW, BAW, etc.) may incur more in-band insertion loss. The higher RF filter or duplexer insertion loss may reduce the wireless receiver noise figure and sensitivity, increase the wireless transmitter power consumption or reduce the transmitted power, and/or deteriorate the overall performance of a communication system.

In commercial systems, the choice of technology may depend on the technical performance, such as power consumption as well as economic and business considerations such as cost, size, and time to market. For instance, while one technology may offer a better performance compared with another technology, it may not be adopted for a commercial system that is cost sensitive. In the case of RF filters and duplexers, it may be desirable to use a technology that leads to the lowest-cost and/or most-compact solution, as long as a predetermined performance criterion is met. In other words, a more expensive or larger solution may not be adopted, even if it offers a better performance as compared with an alternative solution that meets an acceptable performance level at a lower cost and/or size. For instance, while RF filters and duplexers that use BAW resonators may offer lower loss compared with RF filters and duplexers that use SAW resonators for a given set of specifications, the higher relative cost of BAW technology, as well as its relatively smaller number of suppliers, may disfavor their usage in certain applications and standards. Other considerations may be the ease of integration with the rest of the components in a communication system. For instance, there may be performance, business, or economic advantages to integrate RF filters and duplexers with low noise amplifiers (LNA), power amplifiers (PA), transmit/receive (T/R) or band-select switches, impedance matching networks, etc. in a compact RF module. A typical modern wireless communication device, such as a smartphone, may have a number of SAW filters and duplexers as well as a number of BAW filter and duplexers. Each SAW or BAW filter or duplexer may be used for a specific communication application, standard, or frequency band.

Architectural solutions that enable realization of highly-selective low-loss duplexers with high-isolation between transmit and receive bands are highly desirable. Specifically, it is highly desirable to use a lower cost or more compact technology within an innovative architecture that satisfies a comparable or better specification compared to what can be achieved using a more expensive or less compact technology. Examples might include replacing BAW duplexers with SAW duplexers using an innovative architecture, or replacing ceramic or cavity duplexers with BAW duplexers using an innovative architecture.

A conventional method to design acoustic resonator based filters and duplexer is to decide upon the number of resonators to be used depending on the required stopband rejection in the case of filters or the required isolation in the case of duplexers. The larger the number of resonators used in filter design, the larger may be the order of the filter and the higher may be the rejection of out-of-passband frequencies (or higher stopband rejection). Similarly, the number of resonators used in the TX and RX filters of the duplexer may determine the total isolation from TX to RX. The larger the order of the TX and RX filters (i.e., the larger the number of resonators used in them), the larger may be the amount of isolation between TX and RX. Due to the limited quality factor of the acoustic resonators, the insertion loss in the filter and duplexer may be directly proportional to the number of the resonators used. In other words, the larger the order of the filter and the TX and RX filter, the larger may be the loss of the filter and duplexer, respectively. It may be possible to break this insertion loss and isolation or stopband rejection tradeoff by incorporating hybrid couplers in the design of filters and duplexers.

Further limitations and disadvantages of conventional and traditional approaches will become apparent to one of skill in the art, through comparison of such systems with the present disclosure as set forth in the remainder of the present application with reference to the drawings.

BRIEF SUMMARY OF THE DISCLOSURE

A system and/or method for all-acoustic duplexers using directional couplers, substantially as shown in and/or described in connection with at least one of the figures, as set forth more completely in the claims.

An objective of this disclosure is to enable realization of compact, low loss, and low cost radio frequency duplexers. For instance, the disclosure enables realization of high-performance duplexers without utilizing costly process technologies. As a specific example, the disclosure enables realization of acoustic duplexers with a similar or better performance that is currently achievable only using dielectric or air cavity technologies. As another specific example, the disclosure enables realization of acoustic duplexers using low-cost surface acoustic wave processing technology with a similar or better performance that is currently achievable, with a similar compact form factor, only using costly bulk acoustic wave technology.

The disclosure has application in wireless communication systems. For instance, it can be applied to handheld devices such as smartphones, tablets, cell phones, laptops, etc. that support wireless communications. The disclosure can also be applied to wireless communication base stations, including micro-, pico-, and femto-base stations, repeaters, and signal boosters. The disclosure can be used in multi-band, multi-standard, or multi-function wireless platforms.

Various advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

Represented simulation results of various embodiments are only for illustrative reasons, and are not meant to cover all possible responses that various embodiments enable. For instance, the presented simulation results cover filters with a single passband and at least one stopband (or notch) in their transfer functions. Filters with multiple passbands or stopbands may also be realized using the embodiments or other teachings of this disclosure. Filters whose transfer functions fundamentally change as a function of at least one stimulus may also be realized using the embodiments or other teachings of this disclosure.

DETAILED DESCRIPTION OF THE DISCLOSURE

Figure 1:
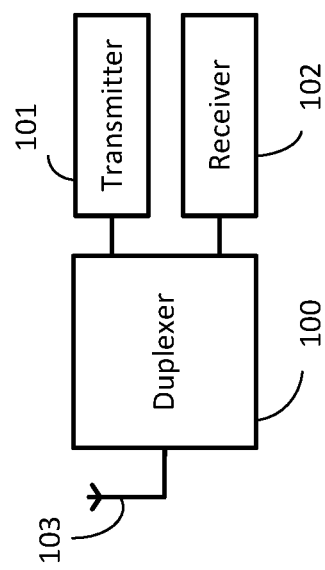
FIG. 1 illustrates a simplified schematic of a frequency division duplex communication transceiver including an antenna, a duplexer, a transmitter, and a receiver.

As utilized herein the terms "circuit" and "circuitry" refer to physical electronic components (i.e. hardware) and any software and/or firmware ("code") which may configure the hardware, be executed by the hardware, and/or otherwise be associated with the hardware. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the term "exemplary" means serving as a non-limiting example, instance, or illustration. As utilized herein, the terms "e.g.," and "for example" set off lists of one or more non-limiting examples, instances, or illustrations.

Illustrative embodiments are now described. Other embodiments may be used in addition or instead. Details that may be apparent to a person of ordinary skill in the art may have been omitted. Some embodiments may be practiced with additional components or steps and/or without all of the components or steps that are described.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference in their entirety.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

FIG. 1 shows a simplified block diagram schematic of a frequency division duplex (FDD) communication system that includes an antenna 103, a frequency duplexer 100, a transmitter 101, and a receiver 102. The duplexer 100 enables utilizing the same antenna for the receiver 102 and the transmitter 101 that operate at different frequency bands.

Figure 2:
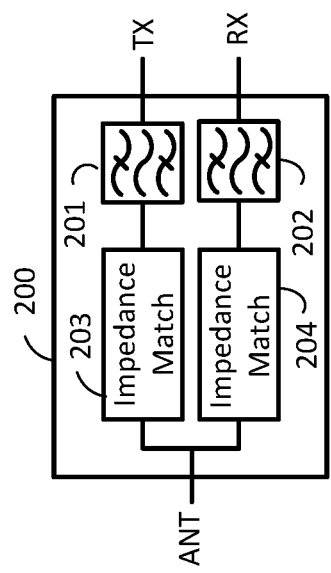
FIG. 2 illustrates a realization of a duplexer including a band-pass filter tuned to the transmit frequency band, a second band-pass filter tuned to the receive frequency band, and appropriate impedance matching networks.

FIG. 2 shows a simplified block diagram schematic of a frequency duplexer 200 that includes a band-pass filter 201 covering the transmit frequency band, a band-pass filter 202 covering the receive frequency band, and impedance matching networks 203 and 204 that enable connection of the filters 201 and 202 to a common antenna port (ANT) while ensuring proper driving point impedances at the transmit and receive frequency bands. In some realizations of frequency duplexers, a three-port passive impedance matching network is used instead of separate 201 and 202 networks. In order to satisfy the isolation requirement between TX and RX ports, the filters 201 and 202 are often designed as high-order filters. In order to have a low insertion loss between the TX and ANT ports and between RX and ANT ports, the high-order filters utilize passive components with high quality factors. Technologies that offer high quality factor passives and resonators are often costly or consume large footprints.

The technology used to create filters 201 and 202 depends on multiple factors including, for example, performance (e.g., in-band insertion loss, out-of-band rejection, TX-RX isolation, power handling, etc.), frequency bands of interest, cost, and form-factor. For instance, in some commercial cellular applications operating at the so-called "Low Band," which is primarily around and below 1 GHz, SAW technology is often used, while in some commercial cellular applications operating at the so-called "High Band," which is primarily around 2 GHz, BAW technology is often used. Typically, BAW duplexers are more expensive compared with SAW duplexers. It is one intention of the proposed disclosure to enable realization of frequency duplexers without requiring expensive acoustic technologies. On the other hand, in some applications, the extremely high performance requirement might necessitate using dielectric filters such as ceramic filters. These filters are typically large. It is another intention of the proposed disclosure to enable realization of high-performance frequency duplexers without requiring bulky dielectric filter technologies.

Figure 3:
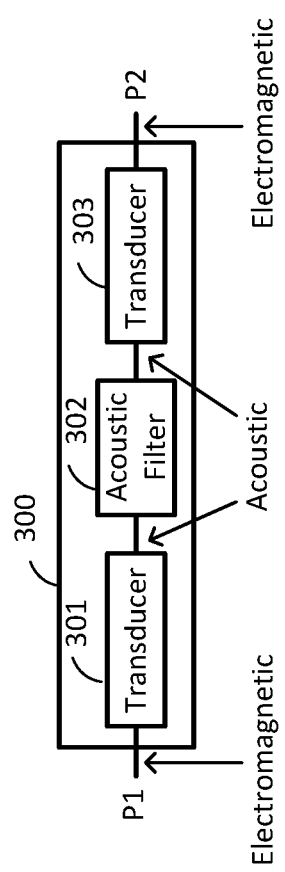
FIG. 3 illustrates a realization of an acoustic RF filter including a pair of transducers and an acoustic filter.

FIG. 3 shows a simplified block diagram of a two-port acoustic filter 300 that includes transducers 301 and 303 that convert the electromagnetic signals to acoustic signals and vice versa, and an acoustic filter part 302. The acoustic filter 300 operates on electromagnetic signals—that is, both ports of the two-port acoustic filter 300 (P1 and P2) interface with electromagnetic signals. In some realizations of acoustic filters, at least some amount of acoustic filtering function is embedded within the transduction function. In order to satisfy the isolation requirement between TX and RX ports of a frequency duplexer, the acoustic filter 302 is often designed as a high-order filter. Acoustic filters are often smaller compared with their electromagnetic counterparts. Acoustic technologies that offer high quality factor components and resonators are needed to keep the pass-band insertion loss of acoustic filters at sufficiently low levels. For instance, bulk acoustic wave technologies may be used to realize extremely selective filters that are needed in frequency duplexers that support FDD schemes with close TX and RX frequency bands. Bulk acoustic wave duplexers are often more expensive when compared with surface acoustic wave duplexers. It is one intention of the proposed disclosure to enable realization of frequency duplexers without requiring expensive acoustic technologies.

Figure 4:
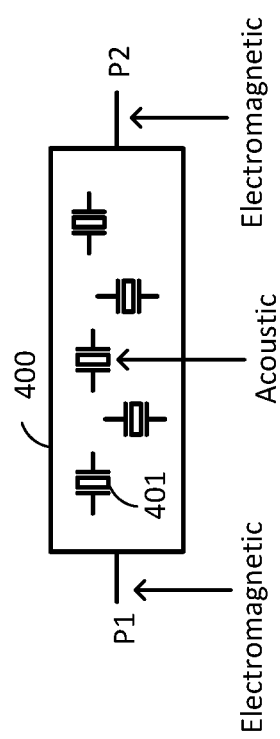
FIG. 4 illustrates a realization of an acoustic RF filter including acoustic resonators.

FIG. 4 shows a conceptual block diagram of an acoustic filter 400 that utilizes acoustic resonators 401 in its realization. Some of the acoustic resonators may be coupled to each other (mechanically, acoustically, or electrically). The filter may be based on surface or bulk acoustic wave technologies. Bulk acoustic wave approach often leads to lower passband insertion loss, but it is often costlier when compared with the surface acoustic wave approach. The filter may include other passive components such as inductors and capacitors too.

Figure 5:
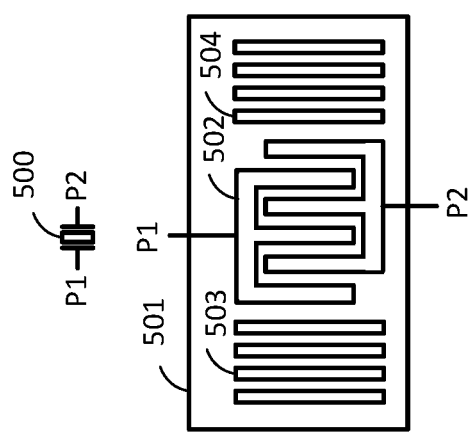
FIG. 5 illustrates a realization of an acoustic resonator.

FIG. 5 shows a simplified schematic of an acoustic resonator 501, whose symbol is referenced as 500, that includes interdigital transducer (IDT) 502 and acoustic reflectors 503 and 504. The resonant frequency or frequencies are determined by the geometries of the IDT 502 and reflectors 503, 504, and spacing between IDT 502 and reflectors 503, 504. This embodiment corresponds to a surface acoustic wave (SAW) resonator. There are several other possible realizations of surface acoustic wave resonators as well as bulk acoustic wave (BAW) resonators.

Figure 6:
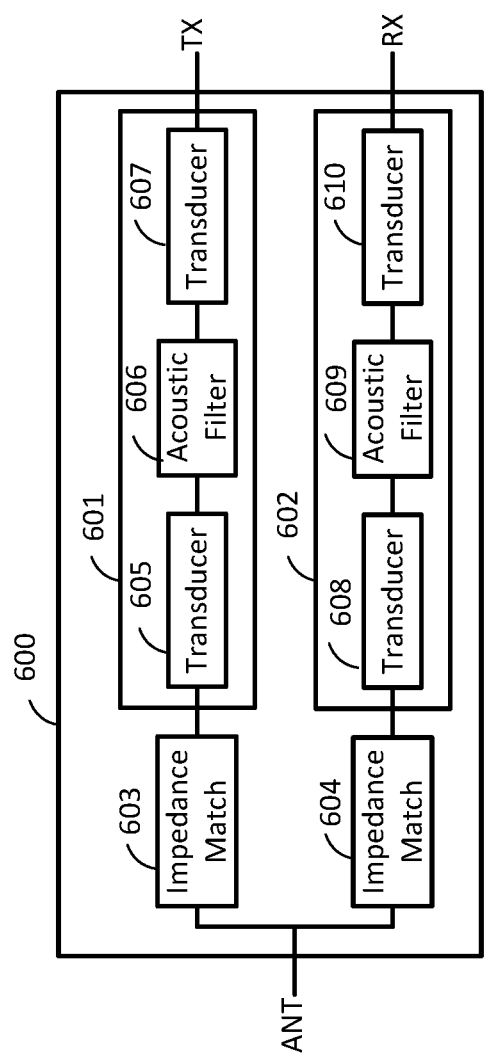
FIG. 6 illustrates a realization of a duplexer including an acoustic RF band-pass filter tuned to the transmit frequency band, a second acoustic RF band-pass filter tuned to the receive frequency band, and appropriate impedance matching networks.

FIG. 6 shows a simplified schematic of a frequency duplexer 600 that includes acoustic filters 601 and 602 covering transmit and receive frequency bands, respectively, and impedance matching networks 603 and 604. In some realizations of frequency duplexers, a three-port passive impedance matching network is used instead of separate 603 and 604 networks. Each of the acoustic filters 601, 602 includes a pair of transducers 605, 607 or 608, 610 and an acoustic filter part 606 or 609. In some realizations of acoustic filters, at least some amount of acoustic filtering function is embedded within the transduction function. The filters may be based on surface or bulk acoustic wave technologies. Bulk acoustic wave approach often leads to lower passband insertion loss, but it is often costlier when compared with the surface acoustic wave approach. Conventional frequency duplexers based on either surface or bulk acoustic wave technologies are available for commercial applications. Acoustic filters 606 and 609 may include other passive components such as inductors and capacitors in their realizations.

Figure 7:
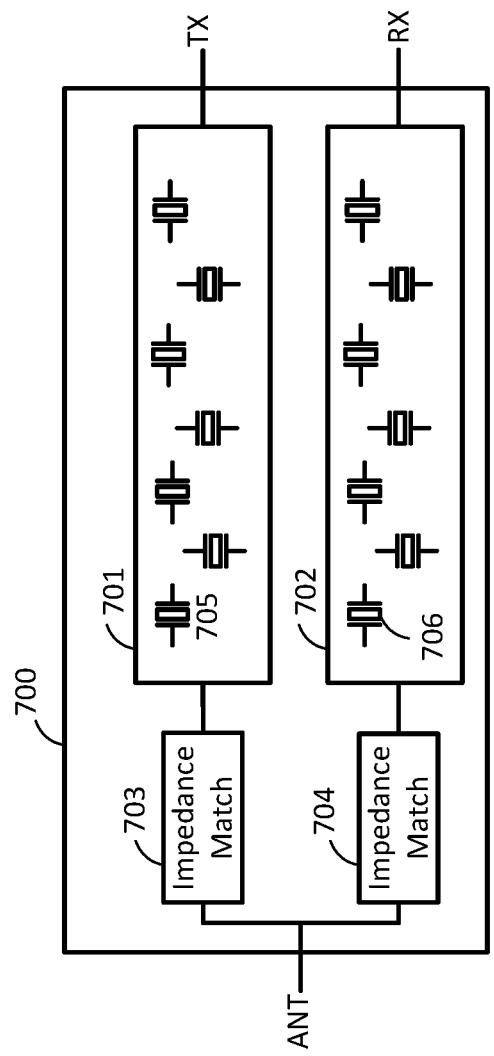
FIG. 7 illustrates a realization of a duplexer including an acoustic resonator-based RF band-pass filter tuned to the transmit frequency band, a second acoustic resonator-based RF band-pass filter tuned to the receive frequency band, and appropriate impedance matching networks.

FIG. 7 shows a simplified schematic of a frequency duplexer 700 that includes resonator-based acoustic filters 701 and 702 covering transmit and receive frequency bands, respectively, and impedance matching networks 703 and 704. Some of the acoustic resonators may be coupled to each other (mechanically, acoustically, or electrically). In some realizations of frequency duplexers, a three-port passive impedance matching network is used instead of separate 703 and 704 networks. Each of the acoustic filters 701, 702 includes acoustic resonators 705, 706. In some realizations of acoustic filters, at least some amount of acoustic filtering function is embedded within the transduction function. The filters may be based on surface or bulk acoustic wave technologies. Bulk acoustic wave approach often leads to lower passband insertion loss, but it is often costlier when compared with the surface acoustic wave approach. Conventional frequency duplexers based on either surface or bulk acoustic wave technologies are available for commercial applications. Acoustic filters 701 and 702 may include other passive components such as inductors and capacitors in their realizations.

Figure 8:
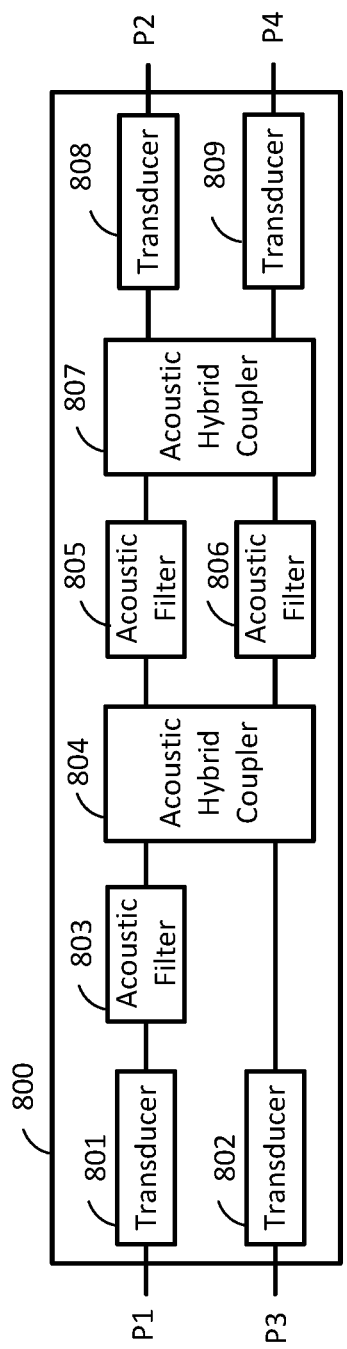
FIG. 8 shows an embodiment of an acoustic duplexer based on this disclosure.

FIG. 8 shows an embodiment of the present disclosure. The 4-port acoustic network 800 operates on electromagnetic signals applied at ports P1, P2, P3, and P4. Electromagnetic signals applied to the 4 ports are converted to acoustic signals through transducers 801, 802, 808, 809. The main operations of the 4-port acoustic network 800 occur in acoustic domain using acoustic filters 803, 805, 806 and acoustic hybrid couplers 804, 807. Acoustic filters 805 and 806 can have the same frequency response and may be constructed to be identical. Acoustic filter 803 has a different frequency response when compared with acoustic filters 805 and 806. Acoustic hybrid couplers 804, 807 split the signal applied to any of their inputs on either side into two signals with nominally equal amplitude and 90° phase difference on the other side. The two ports on the same side of acoustic hybrid couplers are nominally isolated. It is possible that the electromagnetic-acoustic transduction at the ports is embedded within the acoustic filters and acoustic hybrid couplers. Acoustic filter 803 may be omitted in some implementations. Ports P1 and P2 of the 4-port acoustic network are nominally isolated irrespective of the transfer functions of the acoustic filters. Ports P3 and P4 of the 4-port acoustic network are nominally isolated irrespective of the transfer functions of the acoustic filters. The transfer function between ports P2 and P3 depends on the transfer function of the filters 805 and 806. The transfer function between ports P1 and P3 depends on the transfer function of the filter 803 (if present) and the driving point reflection coefficient of the filters 805 and 806. The transfer function between ports P1 and P4 depends on the transfer functions of filters 803 (if present), 805, and 806. The transfer function between ports P2 and P4 depends on the driving port reflection coefficient of filters 805 and 806. Surface acoustic wave technology or bulk acoustic wave technology may be used for any of the acoustic components 803, 804, 805, 806, or 807. Any of these acoustic components may include other passive components such as inductors and capacitors in their realizations. Additional components may be included in the design for various reasons, for instance, to improve the isolation between the adjacent ports.

In one embodiment, the 4-port acoustic network 800 may be used in an FDD communication system. In one such embodiment, port P3, P1, and P2 may be designated as antenna port, transmit port, and receive port, respectively. In this embodiment, the pass-bands of acoustic filters 805 and 806 cover the receive frequency bands while the pass-bands of acoustic filter 803 (if present) cover the transmit frequency bands. Acoustic filters 805 and 806 are designed so that their driving port reflection coefficients are high (ideally magnitude of one) at the transmit frequency bands. In another such embodiment, port P3, P1, and P2 may be designated as antenna port, receive port, and transmit port, respectively. In this embodiment, the pass-bands of acoustic filters 805 and 806 cover the transmit frequency bands while the pass-bands of acoustic filter 803 (if present) cover the receive frequency bands. Acoustic filters 805 and 806 are designed so that their driving port reflection coefficients are high (ideally magnitude of one) at the receive frequency bands. In all such embodiments, port P4 may be terminated to appropriate impedance (either in acoustic or electromagnetic domain) or be used to monitor various features and non-idealities of the four-port acoustic network.

Figure 9:
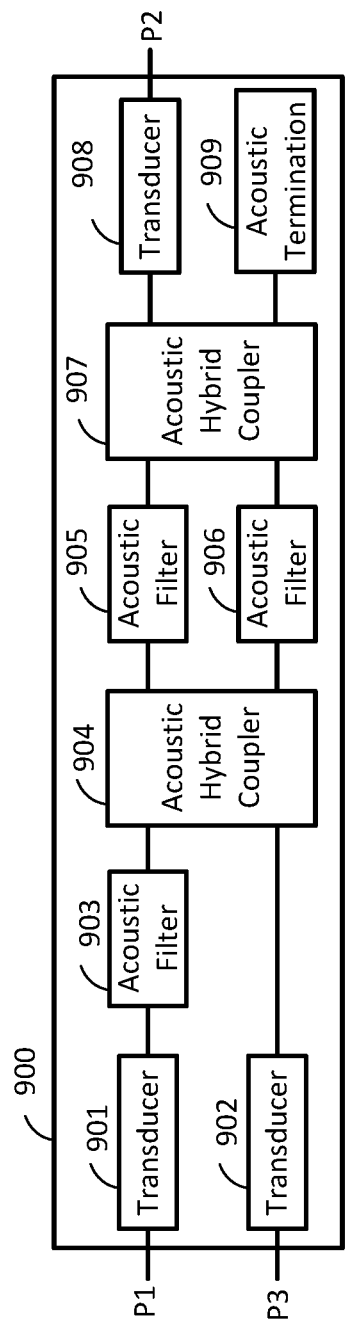
FIG. 9 shows another embodiment of an acoustic duplexer based on this disclosure.

FIG. 9 shows an embodiment of the present disclosure. The 3-port acoustic network 900 operates on electromagnetic signals applied at ports P1, P2, and P3. Electromagnetic signals applied to the 3 ports are converted to acoustic signals through transducers 901, 902, 908. The main operations of the 3-port acoustic network 900 occur in acoustic domain using acoustic filters 903, 905, 906, acoustic hybrid couplers 904, 907, and acoustic termination 909. Acoustic filters 905 and 906 have the same frequency response and may be constructed to be identical. Acoustic filter 903 has a different frequency response when compared with acoustic filters 905 and 906. Acoustic hybrid couplers 904, 907 split the signal applied to any of their inputs on either side into two signals with nominally equal amplitude and 90° phase different on the other side. The two ports on the same side of acoustic hybrid couplers are nominally isolated. Nominally, the acoustic termination 909 absorbs the incident acoustic wave and prohibits acoustic reflections. It is possible that the electromagnetic-acoustic transduction at the ports is embedded within the acoustic filters and acoustic hybrid couplers. Acoustic filter 903 may be omitted in some implementations. Ports P1 and P2 of the 3-port acoustic network 900 are nominally isolated irrespective of the transfer functions of the acoustic filters. The transfer function between ports P2 and P3 depends on the transfer function of the filters 905 and 906. The transfer function between ports P1 and P3 depends on the transfer function of filter 903 (if present) and the driving point reflection coefficient of the filters 905 and 906. Surface acoustic wave technology or bulk acoustic wave technology may be used for any of the acoustic components 903, 904, 905, 906, or 907. Any of these acoustic components may include other passive components such as inductors and capacitors in their realizations.

In one embodiment, the 3-port acoustic network 900 may be used in an FDD communication system. In one such embodiment, port P3, P1, and P2 may be designated as antenna port, transmit port, and receive port, respectively. In this embodiment, the pass-bands of acoustic filters 905 and 906 cover the receive frequency bands while the pass-bands of acoustic filter 903 (if present) cover the transmit frequency bands. Acoustic filters 905 and 906 are designed so that their driving port reflection coefficients are high (ideally magnitude of one) at the transmit frequency bands. In another such embodiment, port P3, P1, and P2 may be designated as antenna port, receive port, and transmit port, respectively. In this embodiment, the pass-bands of acoustic filters 905 and 906 cover the transmit frequency bands while the pass-bands of acoustic filter 903 (if present) cover the receive frequency bands. Acoustic filters 905 and 906 are designed so that their driving port reflection coefficients are high (ideally magnitude of one) at the receive frequency bands.

Figure 10:
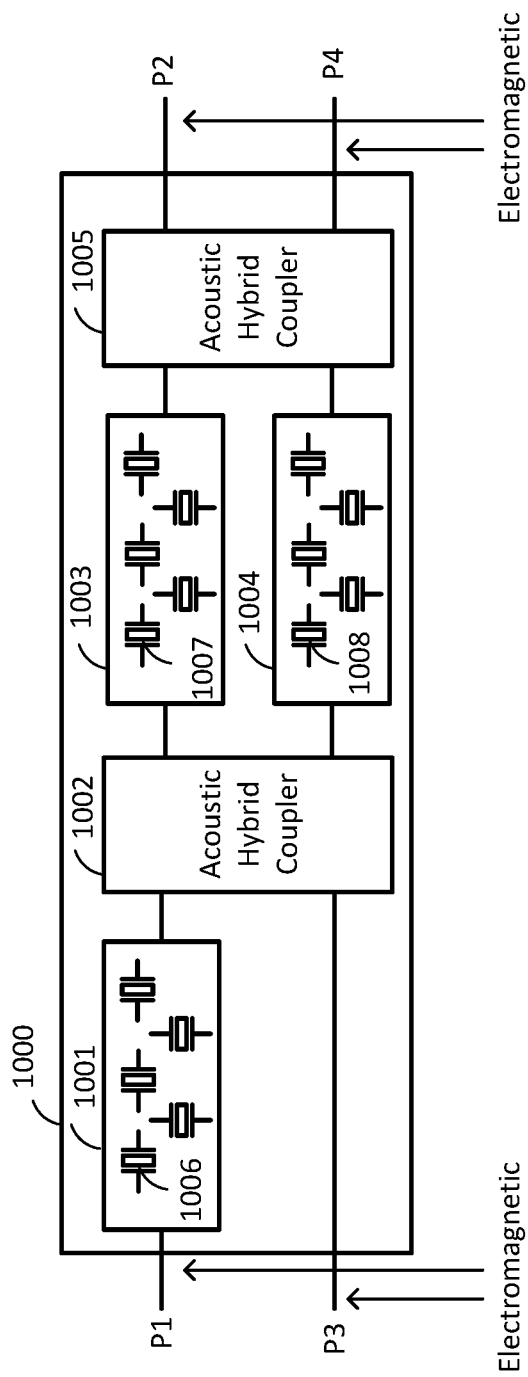
FIG. 10 shows another embodiment of an acoustic duplexer based on this disclosure.

FIG. 10 shows an embodiment of the present disclosure. The 4-port acoustic network 1000 operates on electromagnetic signals applied at ports P1, P2, P3, and P4. The main operations of the 4-port acoustic network 1000 occur in acoustic domain using acoustic filters 1001, 1003, 1004 and acoustic hybrid couplers 1002, 1005. Acoustic filters 1003 and 1004 include acoustic resonators 1007 and 1008 that have the same frequency response and may be constructed to be identical. Acoustic filter 1001 includes acoustic resonators 1006, has a different frequency response when compared with acoustic filters 1003 and 1004, and includes the electromagnetic-acoustic transduction. Acoustic hybrid couplers 1002, 1005 split the signal applied to any of their inputs on either side into two signals with nominally equal amplitude and 90° phase different on the other side. The two ports on the same side of acoustic hybrid couplers are nominally isolated. In this scheme, the electromagnetic-acoustic transduction at the ports is embedded within the acoustic filter 1001 and acoustic hybrid couplers 1002 and 1005. Acoustic filter 1001 may be omitted in some implementations; in such cases, the corresponding electromagnetic-acoustic transduction may be included in the acoustic hybrid coupler 1002. Ports P1 and P2 of the 4-port acoustic network are nominally isolated irrespective of the transfer functions of the acoustic filters. Ports P3 and P4 of the 4-port acoustic network 1000 are nominally isolated irrespective of the transfer functions of the acoustic filters. The transfer function between ports P2 and P3 depends on the transfer function of the filters 1003 and 1004. The transfer function between ports P1 and P3 depends on the transfer function of filter 1001 (if present) and the driving point reflection coefficient of the filters 1003 and 1004. The transfer function between ports P1 and P4 depends on the transfer functions of filters 1001 (if present), 1003, and 1004. The transfer function between ports P2 and P4 depends on the driving port reflection coefficient of filters 1003 and 1004. Surface acoustic wave technology or bulk acoustic wave technology may be used for any of the acoustic components 1001, 1002, 1003, 1004, or 1005. Any of these acoustic components may include other passive components such as inductors and capacitors in their realizations.

Figure 11:
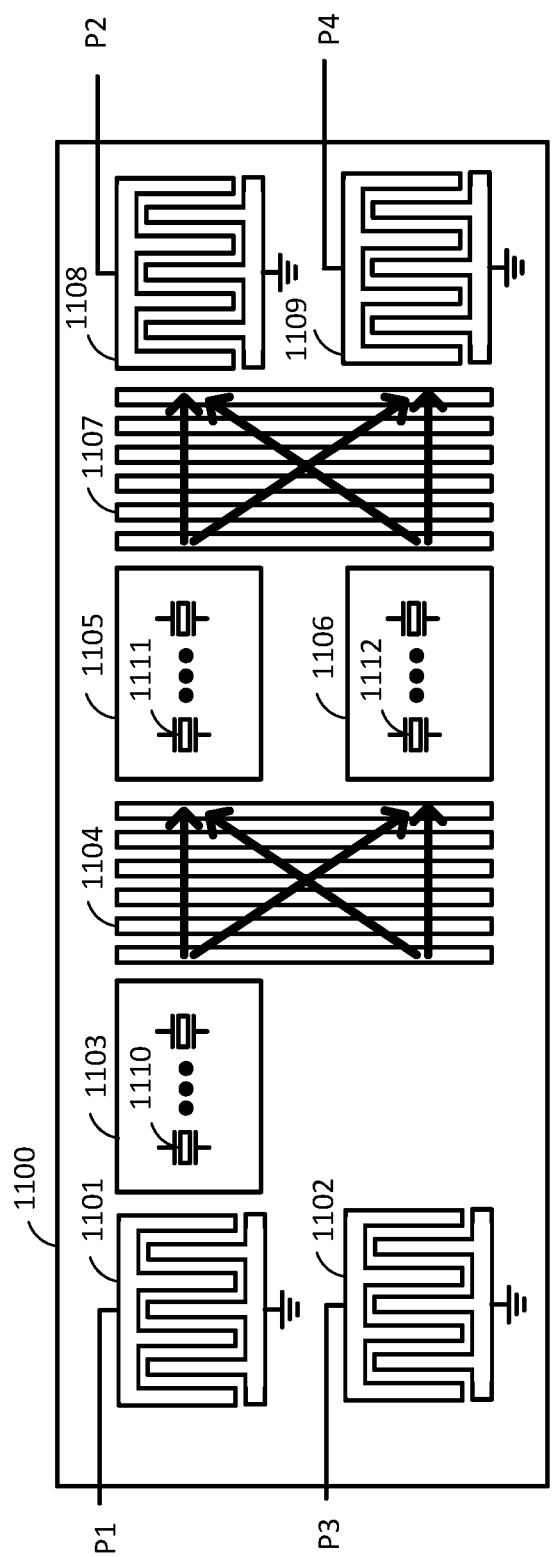
FIG. 11 shows another embodiment of an acoustic duplexer based on this disclosure.

FIG. 11 shows an embodiment of the present disclosure. The 4-port acoustic network 1100 operates on electromagnetic signals applied at ports P1, P2, P3, and P4. Electromagnetic signals applied to the 4 ports are converted to acoustic signals through interdigital transducers 1101, 1102, 1108, 1109. The main operations of the 4-port acoustic network 1100 occur in acoustic domain using acoustic filters 1103, 1105, 1106 and acoustic hybrid couplers 1104, 1107. Acoustic filters 1105 and 1106 include acoustic resonators 1111 and 1112 that have the same frequency response and may be constructed to be identical. Acoustic filter 1103 includes acoustic resonators 1110 and has a different frequency response when compared with acoustic filters 1105 and 1106. Some of the acoustic resonators in any of the acoustic filters may be coupled to each other (mechanically, acoustically, or electrically). Acoustic hybrid couplers 1104, 1107 split the signal applied to any of their inputs on either side into two signals with nominally equal amplitude and 90° phase different on the other side. The two ports on the same side of acoustic hybrid couplers are nominally isolated. It is possible that the electromagnetic-acoustic transduction at the ports is embedded within the acoustic filters and acoustic hybrid couplers. In one embodiment, acoustic hybrid couplers may use coupled acoustic waveguides. Acoustic waveguides can be created by combining regions with different acoustic velocities. Various mechanisms may be used to modify the acoustic velocity. For instance, metal strips on a piezoelectric substrate may lead to changes in acoustic velocity due to mass loading and termination of electric fields associated with the acoustic wave, and as such may be used to create an acoustic waveguide. Proximity of acoustic waveguides may lead to the coupling of acoustic wave between the waveguides. In such a coupled-line acoustic coupler design, the length and spacing of the acoustic waveguides may be selected to realize an acoustic quadrature hybrid coupler. Acoustic waveguides may also be created by selective removal of the piezoelectric substrate (e.g. slot acoustic waveguide). Acoustic filter 1103 may be omitted in some implementations. Ports P1 and P2 of the 4-port acoustic network are nominally isolated irrespective of the transfer functions of the acoustic filters. Ports P3 and P4 of the 4-port acoustic network are nominally isolated irrespective of the transfer functions of the acoustic filters. The transfer function between ports P2 and P3 depends on the transfer function of the filters 1105 and 1106. The transfer function between ports P1 and P3 depends on the transfer function of filter 1103 (if present) and the driving point reflection coefficient of the filters 1105 and 1106. The transfer function between ports P1 and P4 depends on the transfer functions of filters 1103 (if present), 1105, and 1106. The transfer function between ports P2 and P4 depends on the driving port reflection coefficient of filters 1105 and 1106.

Figure 12:
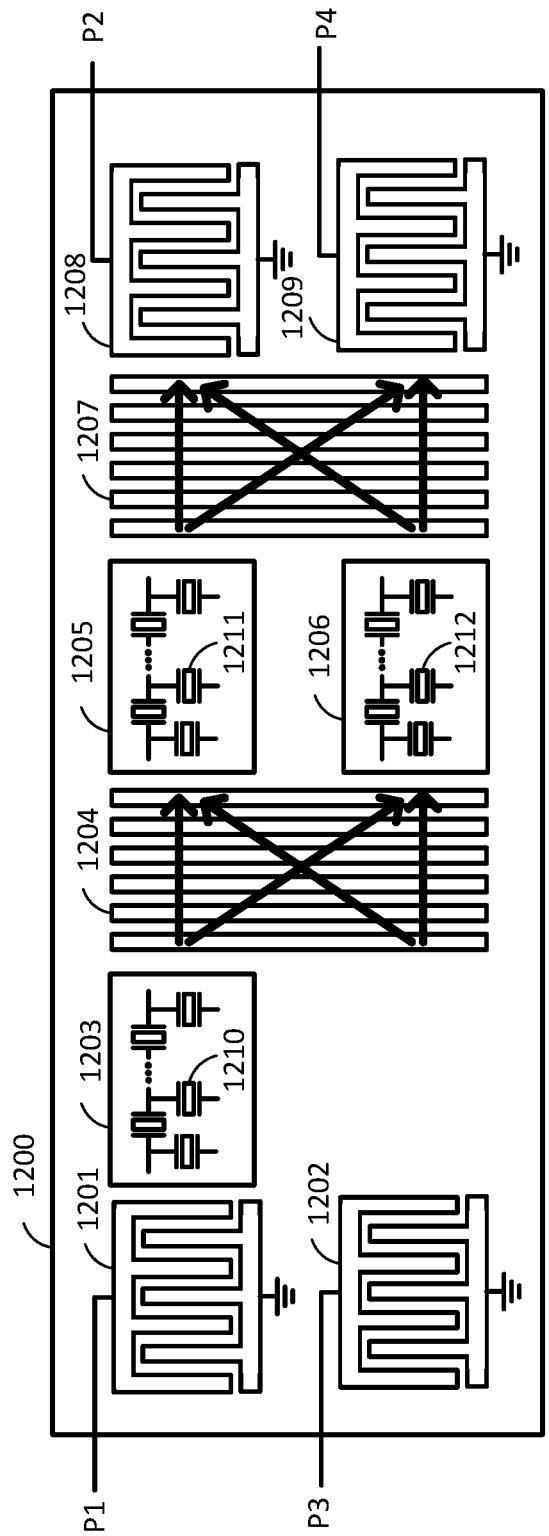
FIG. 12 shows another embodiment of an acoustic duplexer based on this disclosure.

FIG. 12 shows an embodiment of the present disclosure. The 4-port acoustic network 1200 operates on electromagnetic signals applied at ports P1, P2, P3, and P4. Electromagnetic signals applied to the 4 ports are converted to acoustic signals through interdigital transducers 1201, 1202, 1208, 1209. The main operations of the 4-port network occur in acoustic domain using acoustic filters 1203, 1205, 1206 and acoustic hybrid couplers 1204, 1207. Acoustic filters 1205 and 1206 are coupled-resonator-based designs using acoustic resonators 1211 and 1212 that have the same frequency response and may be constructed to be identical. Acoustic filter 1203 is a coupled-resonator-based design using acoustic resonators 1210 and has a different frequency response when compared with acoustic filters 1205 and 1206. Some of the acoustic resonators in any of the acoustic filters may be coupled to each other (mechanically, acoustically, or electrically). Acoustic hybrid couplers 1204, 1207 split the signal applied to any of their inputs on either side into two signals with nominally equal amplitude and 90° phase different on the other side. The two ports on the same side of acoustic hybrid couplers are nominally isolated. It is possible that the electromagnetic-acoustic transduction at the ports is embedded within the acoustic filters and acoustic hybrid couplers. In one embodiment, acoustic hybrid couplers may use acoustic coupled transmission lines. Acoustic filter 1203 may be omitted in some implementations. Ports P1 and P2 of the 4-port acoustic network are nominally isolated irrespective of the transfer functions of the acoustic filters. Ports P3 and P4 of the 4-port acoustic network are nominally isolated irrespective of the transfer functions of the acoustic filters. The transfer function between ports P2 and P3 depends on the transfer function of the filters 1205 and 1206. The transfer function between ports P1 and P3 depends on the transfer function of filter 1203 (if present) and the driving point reflection coefficient of the filters 1205 and 1206. The transfer function between ports P1 and P4 depends on the transfer functions of filters 1203 (if present), 1205, and 1206. The transfer function between ports P2 and P4 depends on the driving port reflection coefficient of filters 1205 and 1206. Any of the acoustic components may include other passive components such as inductors and capacitors in their realizations.

Figure 13:
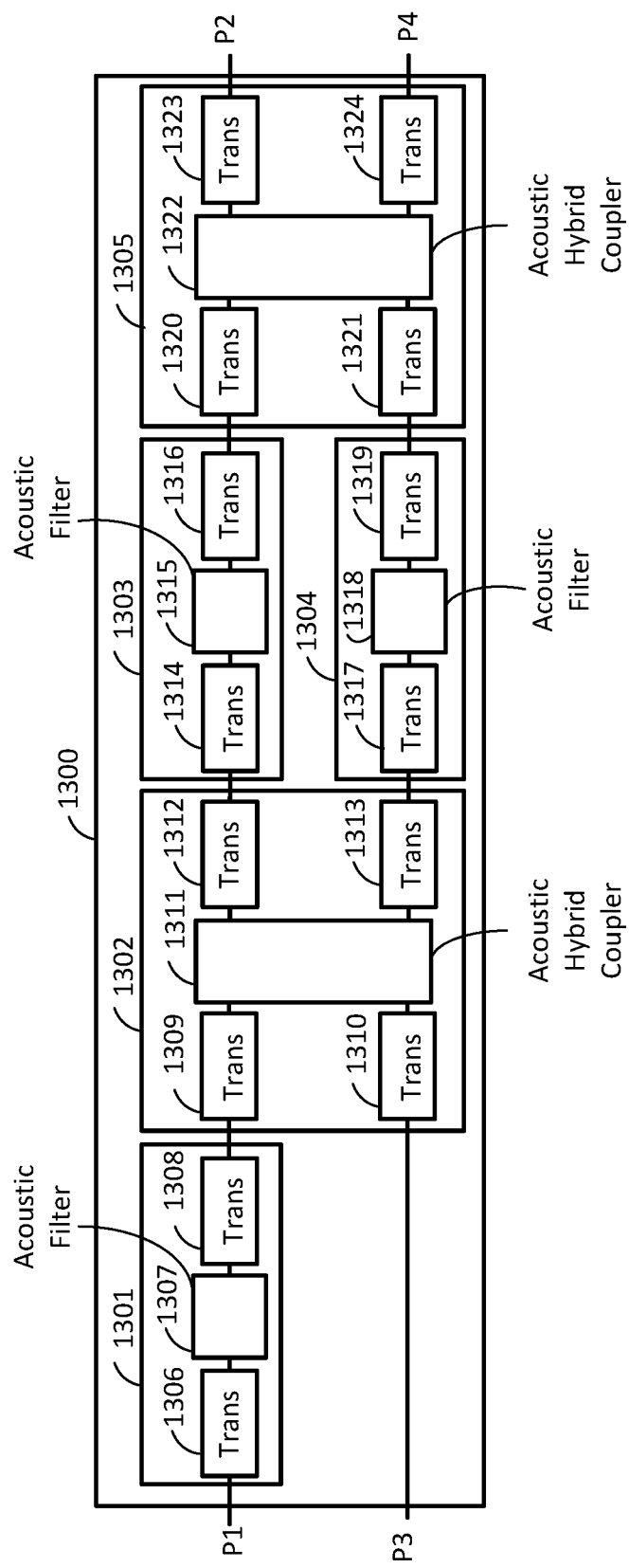
FIG. 13 shows another embodiment of an acoustic duplexer based on this disclosure.

FIG. 13 shows an embodiment of the present disclosure. The 4-port acoustic network 1300 operates on electromagnetic signals applied at ports P1, P2, P3, and P4. The main operations of the 4-port acoustic network 1300 occur in acoustic domain using acoustic filters 1301, 1303, 1304 and acoustic hybrid couplers 1302, 1305. In this embodiment, the interface between the acoustic components 1301, 1302, 1303, 1304, and 1305 occurs via electromagnetic signals. Electromagnetic-acoustic transduction occurs within each of the acoustic components 1301, 1302, 1303, 1304, 1305. Acoustic filters 1303 and 1304 have the same frequency response and may be constructed to be identical. Acoustic filter 1301 has a different frequency response when compared with acoustic filters 1303 and 1304. Acoustic hybrid couplers 1302, 1305 split the signal applied to any of their inputs on either side into two signals with nominally equal amplitude and 90° phase different on the other side. The two ports on the same side of acoustic hybrid couplers are nominally isolated. It is possible that the electromagnetic-acoustic transduction at the ports is embedded within the acoustic filters and acoustic hybrid couplers. Acoustic filter 1301 may be omitted in some implementations. Ports P1 and P2 of the 4-port acoustic network are nominally isolated irrespective of the transfer functions of the acoustic filters. Ports P3 and P4 of the 4-port acoustic network are nominally isolated irrespective of the transfer functions of the acoustic filters. The transfer function between ports P2 and P3 depends on the transfer function of the filters 1303 and 1304. The transfer function between ports P1 and P3 depends on the transfer function of filter 1301 (if present) and the driving point reflection coefficient of the filters 1303 and 1304. The transfer function between ports P1 and P4 depends on the transfer functions of filters 1301 (if present), 1303, and 1304. The transfer function between ports P2 and P4 depends on the driving port reflection coefficient of filters 1303 and 1304. Surface acoustic wave technology or bulk acoustic wave technology may be used for any of the acoustic components 1301, 1302, 1303, 1304, or 1305. Any of these acoustic components may include other passive components such as inductors and capacitors in their realizations.

Figure 14:
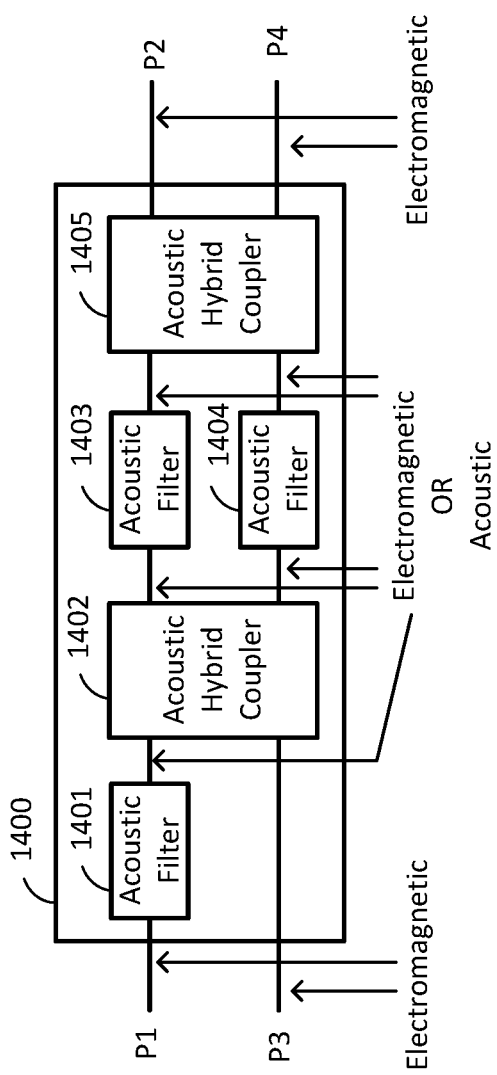
FIG. 14 shows another embodiment of an acoustic duplexer based on this disclosure.

FIG. 14 shows an embodiment of the present disclosure. The 4-port acoustic network 1400 operates on electromagnetic signals applied at ports P1, P2, P3, and P4. The main operations of the 4-port acoustic network 1400 occur in acoustic domain using acoustic filters 1401, 1403, 1404 and acoustic hybrid couplers 1402, 1405. The interface between acoustic components may occur in acoustic domain or in electromagnetic domain. For instance, acoustic waveguides may be used to couple acoustic waves between acoustic components (in acoustic domain). Electromagnetic-acoustic transducers may be used in such interfaces or embedded within the acoustic components. Acoustic filters 1403 and 1404 have the same frequency response and may be constructed to be identical. Acoustic filter 1401 has a different frequency response when compared with acoustic filters 1403 and 1404. Acoustic hybrid couplers split the signal applied to any of their inputs on either side into two signals with nominally equal amplitude and 90° phase different on the other side. The two ports on the same side of acoustic hybrid couplers are nominally isolated. It is possible that the electromagnetic-acoustic transduction at the ports is embedded within the acoustic filters and acoustic hybrid couplers. Acoustic filter 1401 may be omitted in some implementations. Ports P1 and P2 of the 4-port acoustic network are nominally isolated irrespective of the transfer functions of the acoustic filters. Ports P3 and P4 of the 4-port acoustic network are nominally isolated irrespective of the transfer functions of the acoustic filters. The transfer function between ports P2 and P3 depends on the transfer function of the filters 1403 and 1404. The transfer function between ports P1 and P3 depends on the transfer function of the filter 1401 (if present) and the driving point reflection coefficient of the filters 1403 and 1404. The transfer function between ports P1 and P4 depends on the transfer functions of filters 1401 (if present), 1403, and 1404. The transfer function between ports P2 and P4 depends on the driving port reflection coefficient of filters 1403 and 1404. Surface acoustic wave technology or bulk acoustic wave technology may be used for any of the acoustic components 1401, 1402, 1403, 1404, or 1405. Any of these acoustic components may include other passive components such as inductors and capacitors in their realizations.

In one embodiment, the 4-port acoustic network 1400 may be used in an FDD communication system. In one such embodiment, port P3, P1, and P2 may be designated as antenna port, transmit port, and receive port, respectively. In this embodiment, the pass-bands of acoustic filters 1403 and 1404 cover the receive frequency bands while the pass-bands of acoustic filter 1401 (if present) cover the transmit frequency bands. Acoustic filters 1403 and 1404 are designed so that their driving port reflection coefficients are high (ideally magnitude of one) at the transmit frequency bands. In another such embodiment, port P3, P1, and P2 may be designated as antenna port, receive port, and transmit port, respectively. In this embodiment, the pass-bands of acoustic filters 1403 and 1404 cover the transmit frequency bands while the pass-bands of acoustic filter 1401 (if present) cover the receive frequency bands. Acoustic filters 1403 and 1404 are designed so that their driving port reflection coefficients are high (ideally magnitude of one) at the receive frequency bands. In all such embodiments, port P4 may be terminated to appropriate impedance (either in acoustic or electromagnetic domain) or be used to monitor various features and non-idealities of the four-port acoustic network.

Figure 15:
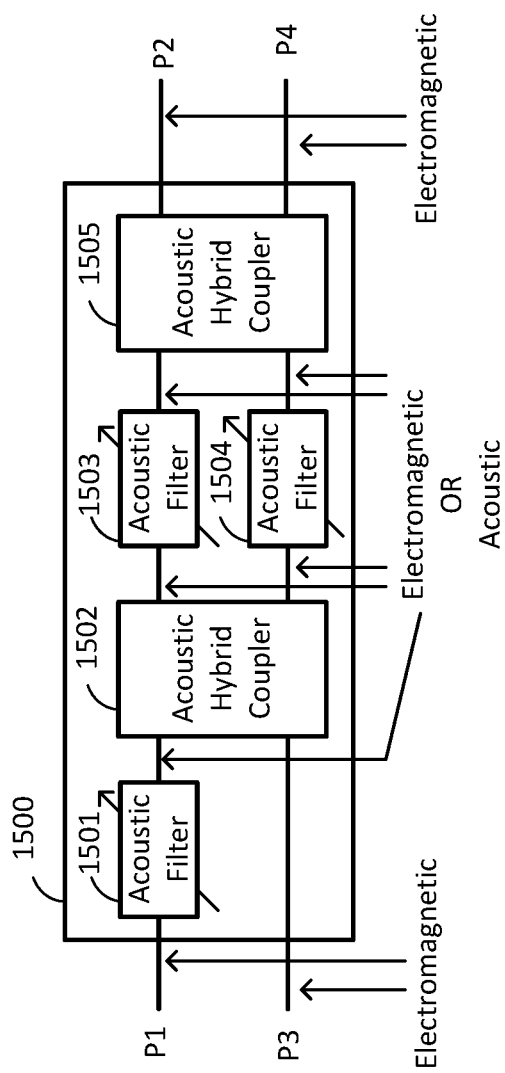
FIG. 15 shows another embodiment of an acoustic duplexer based on this disclosure wherein at least one of the acoustic components can be tuned in response to an electrical stimulus.

FIG. 15 shows an embodiment of the present disclosure. The 4-port acoustic network 1500 operates on electromagnetic signals applied at ports P1, P2, P3, and P4. The main operations of the tunable or reconfigurable 4-port acoustic network 1500 occur in acoustic domain using acoustic filters 1501, 1503, 1504 and acoustic hybrid couplers 1502, 1505. The interface between acoustic components may occur in acoustic domain or in electromagnetic domain. Electromagnetic-acoustic transducers may be used in such interfaces or embedded within the acoustic components. Acoustic filters 1503 and 1504 have the same frequency response and may be constructed to be identical. Acoustic filter 1501 has a different frequency response when compared with acoustic filters 1503 and 1504. Any one of the acoustic filters 1501, 1503, or 1504 may be tunable or reconfigurable. For instance, the transfer function of any of the acoustic filters may be changeable with the application of a stimulus or stimuli such as voltage or current that may be analog or digital. Acoustic hybrid couplers split the signal applied to any of their inputs on either side into two signals with nominally equal amplitude and 90° phase different on the other side. The two ports on the same side of acoustic hybrid couplers are nominally isolated. It is possible that the electromagnetic-acoustic transduction at the ports is embedded within the acoustic filters and acoustic hybrid couplers. Acoustic filter 1501 may be omitted in some implementations. Ports P1 and P2 of the 4-port tunable or reconfigurable acoustic network are nominally isolated irrespective of the transfer functions of the acoustic filters. Ports P3 and P4 of the 4-port tunable or reconfigurable acoustic network are nominally isolated irrespective of the transfer functions of the acoustic filters. The transfer function between ports P2 and P3 depends on the transfer function of the filters 1503 and 1504. The transfer function between ports P1 and P3 depends on the transfer function of the filter 1501 (if present) and the driving point reflection coefficient of the filters 1503 and 1504. The transfer function between ports P1 and P4 depends on the transfer functions of filters 1501 (if present), 1503, and 1504. The transfer function between ports P2 and P4 depends on the driving port reflection coefficient of filters 1503 and 1504. Surface acoustic wave technology or bulk acoustic wave technology may be used for any of the acoustic components 1501, 1502, 1503, 1504, or 1505. Any of these acoustic components may include other passive components such as inductors and capacitors in their realizations.

In one embodiment, the 4-port tunable or reconfigurable acoustic network 1500 may be used in an FDD communication system. In one embodiment, the 4-port tunable or reconfigurable acoustic network 1500 may be used in a multi-standard communication system. In one such embodiment, port P3, P1, and P2 may be designated as antenna port, transmit port, and receive port, respectively. In this embodiment, the pass-bands of acoustic filters 1503 and 1504 cover the receive frequency bands while the pass-bands of acoustic filter 1501 (if present) cover the transmit frequency bands. Acoustic filters 1503 and 1504 are designed so that their driving port reflection coefficients are high (ideally magnitude of one) at the transmit frequency bands. In another such embodiment, port P3, P1, and P2 may be designated as antenna port, receive port, and transmit port, respectively. In this embodiment, the pass-bands of acoustic filters 1503 and 1504 cover the transmit frequency bands while the pass-bands of acoustic filter 1501 (if present) cover the receive frequency bands. Acoustic filters 1503 and 1504 are designed so that their driving port reflection coefficients are high (ideally magnitude of one) at the receive frequency bands. In all such embodiments, port P4 may be terminated to appropriate impedance (either in acoustic or electromagnetic domain) or be used to monitor various features and non-idealities of the four-port acoustic network.

Various mechanisms may be used to realize a tunable transfer function in acoustic filters. For instance, a bank of switchable acoustic filters, each with a different frequency response, may be used to realize a tunable acoustic filter. Alternatively, tunable or switchable electromagnetic components such as switched capacitors, switched inductors, variable capacitors (varactors), diodes, etc. may be used in the acoustic filters to enable a tunable transfer function. Alternatively, a tunable or reconfigurable acoustic filter may be constructed from an array of switchable acoustic resonators. The SAW device may be tunable or reconfigurable using micro-electro-mechanical systems (MEMS). Acoustic filter transfer functions may be modified by changing the acoustic wave velocity. Acoustic wave velocity may be modified, for instance, by applying electric field across or modifying the carrier density in a semiconducting piezoelectric substrate. Combination of the aforementioned techniques may be used to realize a tunable filter transfer function.

Figure 16:
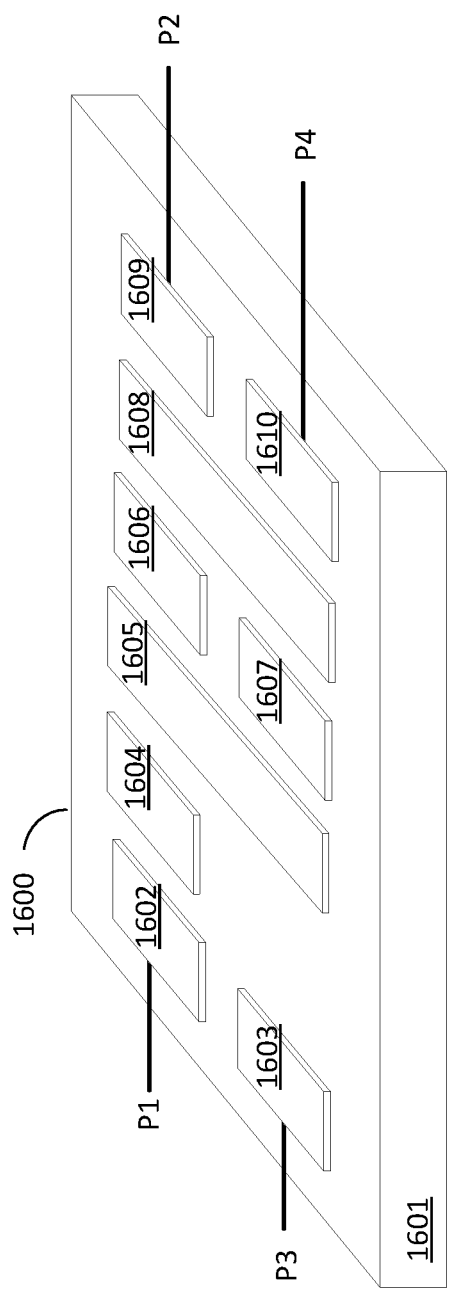
FIG. 16 shows an embodiment of an acoustic duplexer based on this disclosure wherein the duplexer is realized monolithically on a piezoelectric substrate.

FIG. 16 shows an embodiment of the present disclosure. The monolithic 4-port network 1600 includes a common substrate 1601 and a number of components 1602, 1603, 1604, 1605, 1606, 1607, 1608, 1609, 1610 that are monolithically integrated on the common substrate 1601. The integrated components 1602, 1603, 1604, 1605, 1606, 1607, 1608, 1609, and 1610 are primarily acoustic or electroacoustic components. The electromagnetic-acoustic induction is done within one or more of these components. In one embodiment, integrated components 1602, 1603, 1609, and 1610 may correspond to transducers. In one embodiment, integrated components 1604, 1606, and 1607 may correspond to acoustic filters. Integration of acoustic filters on the same substrate leads to better matching over process and temperature variations. In one embodiment, integrated components 1605 and 1608 may correspond to acoustic hybrid couplers. In one embodiment, the common substrate 1601 may be a piezoelectric material including, but not limited to, quartz, lithium niobate, lithium tantalite, lanthanum gallium silicate, zinc oxide, gallium nitride, aluminum nitride, etc. that may be used to create surface acoustic wave devices. In one embodiment, some of the interfaces between the integrated components may be acoustic signals. In one embodiment, the substrate may include multiple layers where each layer is composed of a different material; for instance, the substrate may include a low-cost material for mechanical support at the bottom and a piezoelectric material on the top for the electro-acoustic transduction and/or realization of acoustic devices. In one embodiment, the substrate may include semiconductor material; in such a scenario, in addition to acoustic devices, active electronic devices such as diodes and transistors may be realized on the same substrate. In one embodiment, some of the interfaces between the integrated components may be electromagnetic signals.

In one embodiment, the 4-port network 1600 may be used in an FDD communication system. In one such embodiment, ports P3, P1, and P2 may be designated as antenna port, transmit port, and receive port respectively. In another such embodiment, ports P3, P1, and P2 may be designated as antenna port, receive port, and transmit port respectively. In all such embodiments, port P4 may be terminated to appropriate impedance (either in acoustic or electromagnetic domain) or be used to monitor various features and non-idealities of the four-port acoustic network. In one embodiment, the 4-port network 1600 may be based on a surface acoustic wave technology to replace a duplexer that is realized using more expensive bulk acoustic wave technology. In one embodiment, the 4-port network 1600 may be sealed within a package. In such an embodiment, the package may include other components such as inductors and capacitors. In another embodiment, the 4-port network 1600 may be packaged along with other functional devices such as filters, duplexers, switches, amplifiers, and antennas.

Figure 17:
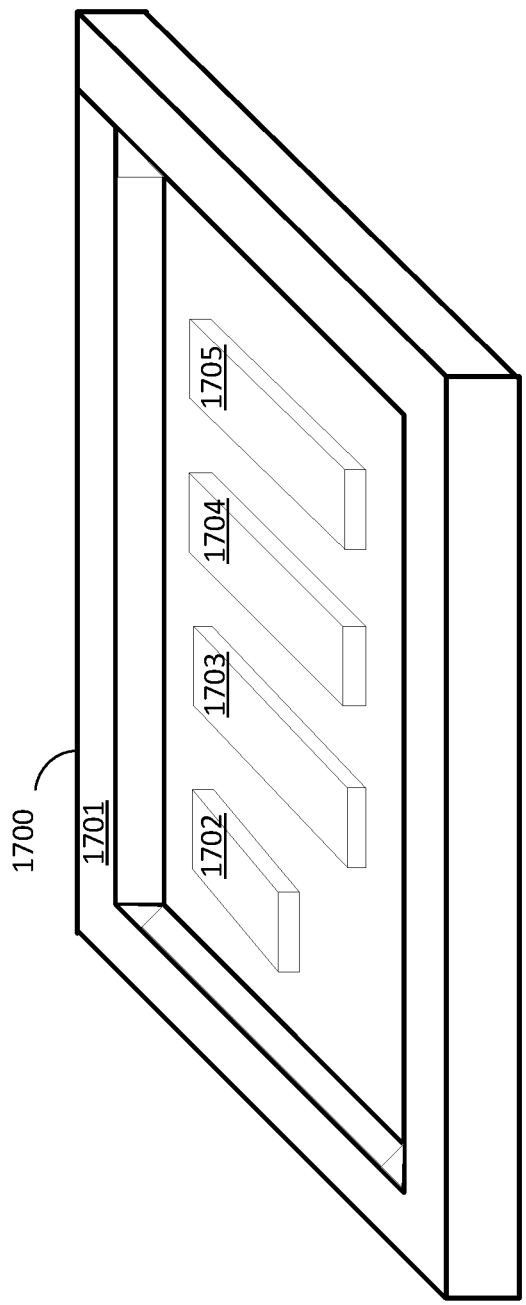
FIG. 17 shows an embodiment of an acoustic duplexer based on this disclosure wherein all the individual acoustic components are integrated in a single package.

FIG. 17 shows an embodiment of the present disclosure. The network 1700 includes a common package 1701 and a number of components 1702, 1703, 1704, and 1705 that are embedded in the common package 1701. Each of the components 1702, 1703, 1704, and 1705 may be primarily acoustic or electromagnetic. The interface between various components is electromagnetic which may be provided through wires, waveguides, transmission lines, pins, solders, vias, etc. Each of the components 1702, 1703, 1704, and 1705 may be attached to the package through an adhesive material or through solder bumps. In one embodiment, component 1702 may be an acoustic filter. In one embodiment, components 1703 and 1705 may be acoustic hybrid couplers. In one embodiment, component 1704 may include a pair of matched, acoustic filters. Each of the components 1702, 1703, 1704, or 1705 may be based on surface acoustic wave or bulk acoustic wave technologies. It is possible that some of the components 1702, 1703, 1704, or 1705 are placed on top of other components in a stacked configuration. In one embodiment, the network 1700 may be used in an FDD communication system as a frequency duplexer. In one embodiment, the network 1700 interfaces with the outside world through electromagnetic signals that may be provided through wires, wire-bonds, waveguides, transmission lines, pins, solders, etc. The network 1700 may enable rapid realization of compact high-performance duplexers using commercially available acoustic components 1702, 1703, 1704, or 1705. In one embodiment, the network 1700 may replace duplexers that are based on bulky dielectric filters such as ceramic filters.

Other embodiments of the disclosure may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for all-acoustic duplexers using directional couplers.

Accordingly, aspects of the present disclosure may be realized in hardware, software, or a combination of hardware and software. The present disclosure may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

Aspects of the present disclosure may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:
1. A radio frequency (RF) duplexer, comprising:
at least a first port, a second port, and a third port; and
a plurality of acoustic components comprising at least:
   a first acoustic filter that is coupled to the first port;
   a second acoustic filter;
   a third acoustic filter that is substantially similar to the second acoustic filter;

a first acoustic quadrature hybrid coupler that is configured to couple signals from the first acoustic filter and the third port to the second acoustic filter and the third acoustic filter; and a second acoustic quadrature hybrid coupler that is configured to couple signals from the second acoustic filter and the third acoustic filter to the second port, wherein the third port is a common port to the first port and the second port, wherein the first port and the second port are isolated, and wherein a transfer function between the first port and the third port and a transfer function between the second port and the third port have passbands at different frequencies as determined by the first acoustic filter, the second acoustic filter, and the third acoustic filter.

2. The RF duplexer of claim 1, wherein the second acoustic quadrature hybrid coupler is coupled to a fourth port, and the fourth port is coupled to an electrical termination.

3. The RF duplexer of claim 1, wherein the second acoustic quadrature hybrid coupler is coupled to an acoustic termination.

4. The RF duplexer of claim 1, wherein RF signals from one or more of the first port, the second port, and the third port are coupled to the acoustic components in the RF duplexer using interdigital transducers.

5. The RF duplexer of claim 1, wherein one or more of the first acoustic filter, the second acoustic filter, and the third acoustic filter use at least one acoustic resonator.

6. The RF duplexer of claim 1, wherein one or more of the first acoustic filter, the second acoustic filter, and the third acoustic filter include a ladder filter or a transversal filter.

7. The RF duplexer of claim 1, wherein one or both of the first acoustic quadrature hybrid coupler and the second acoustic quadrature hybrid coupler are realized using coupled acoustic waveguides.

8. The RF duplexer of claim 1, wherein the RF duplexer is realized monolithically on a piezoelectric substrate.

9. The RF duplexer of claim 8 wherein the piezoelectric substrate is a semiconductor substrate.

10. The RF duplexer of claim 1, wherein the RF duplexer components are integrated into a single package.

11. The RF duplexer of claim 1, wherein at least one of the acoustic components includes at least one capacitor or at least one inductor.

12. The RF duplexer of claim 1, wherein at least one of the acoustic components can be tuned by applying at least one electrical stimulus.

13. The RF duplexer of claim 1, comprising at least one switchable component in at least one of the acoustic components, wherein a response of the acoustic component includes that the switchable component changes for different states of the switchable component.

14. The RF duplexer of claim 1, wherein the RF duplexer is used in a multi-standard system or a multi-band communication system.

15. The RF duplexer of claim 1, wherein at least one of the acoustic components in the RF duplexer uses surface acoustic waves or bulk acoustic waves.

16. The RF duplexer of claim 1, wherein the first acoustic filter corresponds to frequency bands of a transmitter, and the second and the third acoustic filters correspond to the frequency bands of a receiver.

17. The RF duplexer of claim 1, wherein the first acoustic filter correspond to frequency bands of a receiver, and the second and third acoustic filters correspond to the frequency bands of a transmitter.

18. The RF duplexer of claim 1, wherein one or more of the first acoustic filter, the second acoustic filter, and the third acoustic filter comprise multiple passbands.

19. The RF duplexer of claim 1, wherein the radio frequency duplexer is configured to support cellular wireless communications.

20. The RF duplexer of claim 1, comprising electrical components that improve one or more of:

an impedance matching of one or more of the first port, the second port, and the third port;

an isolation between the first port and the second port; and a rejection in certain frequencies in the transfer function between any pair of the first port, the second port, and the third port.

* * * * *